United States Patent [19]
Reinberg

[11] Patent Number: 5,872,048
[45] Date of Patent: Feb. 16, 1999

[54] PROCESSING METHODS OF FORMING AN ELECTRICALLY CONDUCTIVE PLUG TO A NODE LOCATION

[75] Inventor: Alan R. Reinberg, Boise, Id.

[73] Assignee: Micron Technology, Inc., Boise, Id.

[21] Appl. No.: 808,603

[22] Filed: Feb. 28, 1997

[51] Int. Cl.[6] .................................................. H01L 21/70
[52] U.S. Cl. .......................... 438/584; 438/253; 438/397
[58] Field of Search ................................... 438/253, 626, 438/397; 257/308, 310

[56] References Cited

U.S. PATENT DOCUMENTS

| | | | |
|---|---|---|---|
| 5,084,406 | 1/1992 | Rhodes et al. | 438/626 |
| 5,338,700 | 8/1994 | Dennison et al. | 438/253 |
| 5,354,705 | 10/1994 | Mathews et al. | 438/397 |
| 5,488,011 | 1/1996 | Figura et al. | 438/253 |
| 5,496,773 | 3/1996 | Rhodes et al. | 438/626 |
| 5,605,857 | 2/1997 | Jost et al. | 148/DIG. 50 |

OTHER PUBLICATIONS

M. Sakao, N. Kasai, T. Ishijima, E. Ikawa, H. Watanabe, K. Terada and T. Kikkawa, "A Capacitor–Over–Bit–Line (COB) Cell with a Hemispherical–Grain Storage Node for 64mb DRAMs," Microelectronics Research Laboratories, NEC Corporation, 1990, pp. 27.3.1–27.3.4.

*Primary Examiner*—Peter Toby Brown
*Assistant Examiner*—Maria Guerrero

*Attorney, Agent, or Firm*—Wells, St. John, Roberts, Gregory & Matkin, P.S.

[57] ABSTRACT

Methods of forming electrical connections with an integrated circuitry substrate node location are described. According to one aspect of the invention, a substrate node location is laterally surrounded with insulating material and left outwardly exposed. Conductive material is deposited over the exposed node location. Subsequently, a photomaskless etch of the conductive material is conducted to a degree sufficient to leave a plug of conductive material over the node location. In a preferred implementation, the insulating material with which such node location is surrounded constitutes insulating material portions which are provided relative to conductive lines which are formed over the substrate. In another preferred implementation, such conductive lines form a grid of insulating material which, in turn, defines the node location. According to a preferred aspect of the invention, a plurality of insulated conductive lines are formed over a substrate. At least some of the conductive lines constitute word lines and at least some of the conductive lines constitute bit lines. The lines are preferably formed to define and laterally surround an active area substrate location. The substrate location is preferably surrounded by at least four of the lines. Conductive material is deposited over the substrate and the conductive lines and in electrical contact with the node location. The conductive material is then removed to a degree sufficient to form an isolated plug of conductive material over the node location and between the four conductive lines.

29 Claims, 8 Drawing Sheets

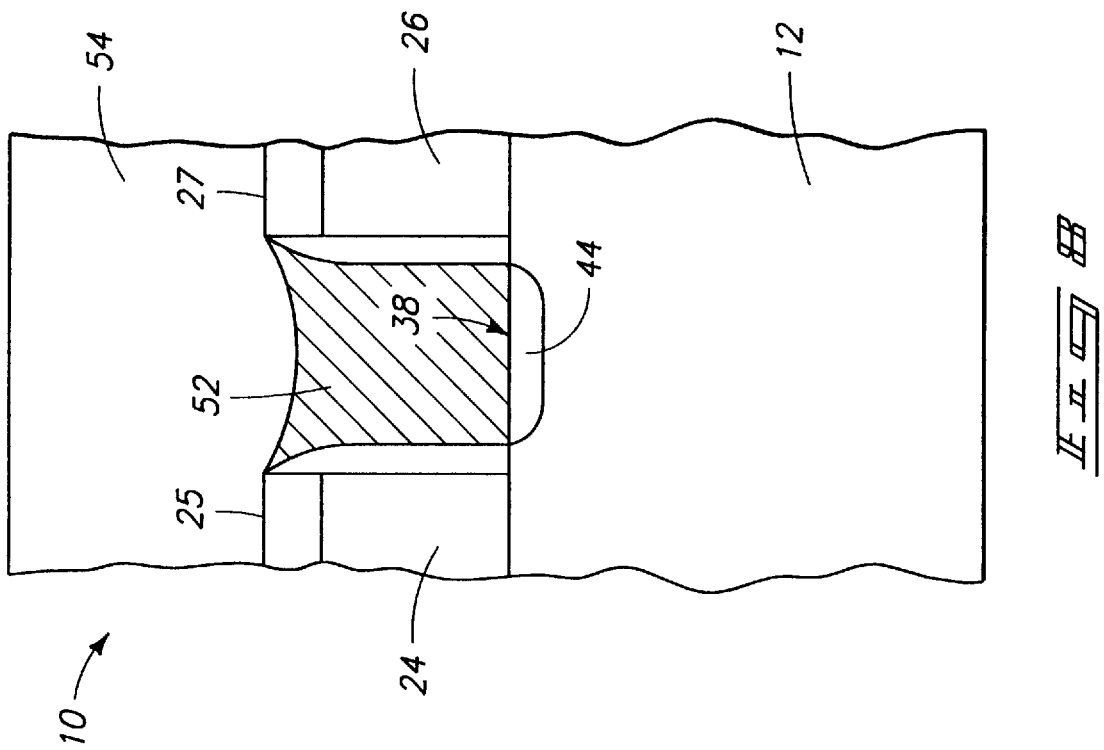
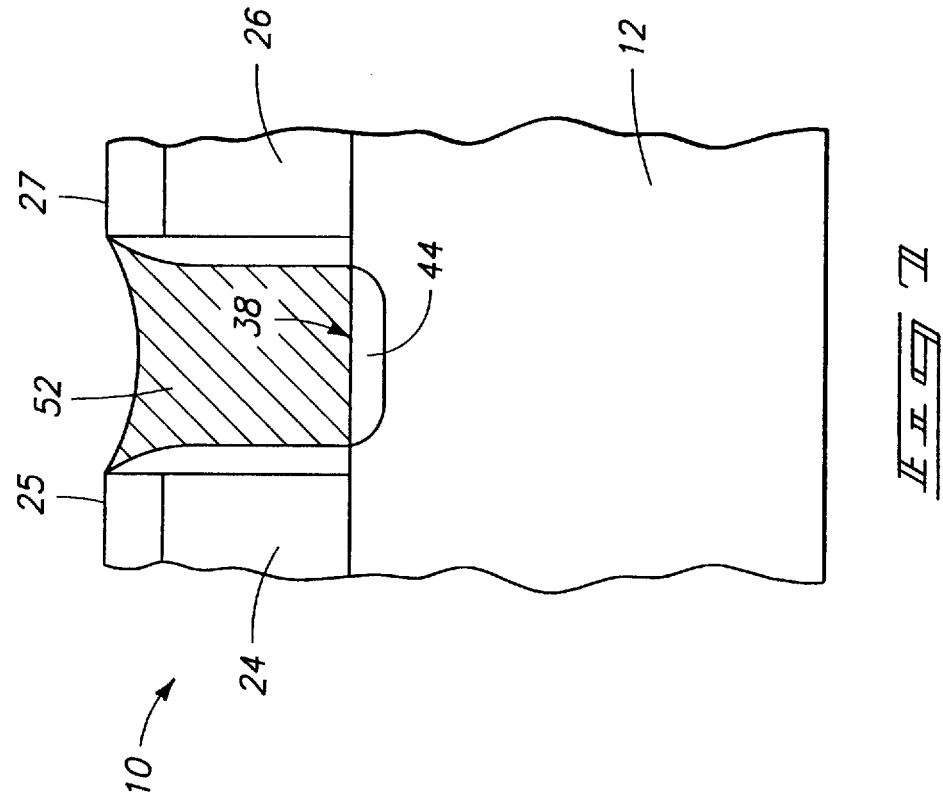

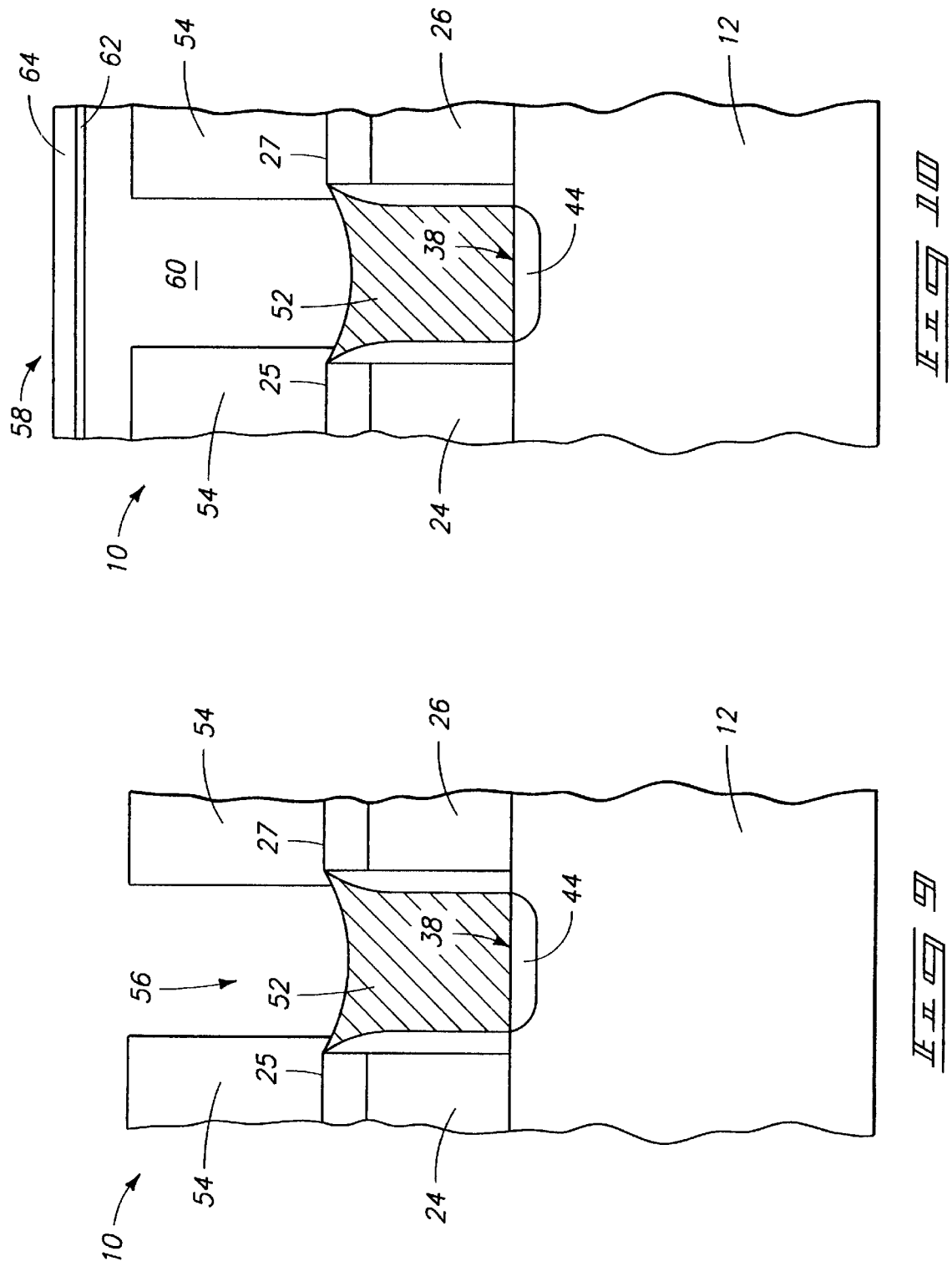

PROCESSING METHODS OF FORMING AN ELECTRICALLY CONDUCTIVE PLUG TO A NODE LOCATION

TECHNICAL FIELD

This invention concerns processing methods of forming an electrically conductive plug to a node location. This invention also concerns methods of forming an electrical connection with an integrated circuit memory cell node location.

BACKGROUND OF THE INVENTION

Fabrication of integrated circuitry typically involves forming electrical connections to substrate node locations. In the context of integrated circuit memory devices, such as dynamic random access memory devices, such electrical connections include those which are made to and between storage capacitors and substrate diffusion regions.

In the past, there have been at least two ways to make such electrical connections. A first way of forming such electrical connections involves depositing a thick insulator material, such as borophosphosilicate glass, over the substrate and then conducting a self-aligned etch thereof to form a contact opening. The contact opening, or at least a portion thereof, is subsequently filled with conductive material. As aspect ratios of such contact openings increase, it becomes more challenging to form such openings and electrical connections. A second way of forming such electrical connections involves depositing a conductive material over the entire substrate, patterning and etching such material to define desired electrical connections, and subsequently forming an insulating dielectric layer over the substrate. Contact openings can then be etched through the dielectric layer. Again, challenges are posed with respect to etching the contact openings through the dielectric layer.

This invention grew out of concerns associated with improving the manner in which electrical connections are made to or with integrated circuit substrate node locations. This invention also grew out of concerns associated with improving the manner in which electrical connections are made with integrated circuit memory cell node locations.

SUMMARY OF THE INVENTION

Methods of forming electrical connections with an integrated circuit substrate node location are described. According to one aspect of the invention, a substrate node location is laterally surrounded with insulating material and left outwardly exposed. Conductive material is deposited over the exposed node location. Subsequently, a photomaskless etch of the conductive material is conducted to a degree sufficient to leave a plug of conductive material over the node location. In a preferred implementation, the insulating material with which such node location is surrounded constitutes insulating material portions which are provided relative to conductive lines which are formed over the substrate. In another preferred implementation, such conductive lines form a grid of insulating material which, in turn, defines the node location. According to a preferred aspect of the invention, a plurality of insulated conductive lines are formed over a substrate. At least some of the conductive lines constitute word lines and at least some of the conductive lines constitute bit lines. The lines are preferably formed to define and laterally surround an active area substrate location. The substrate location is preferably surrounded by at least four of the lines. Conductive material is deposited over the substrate and the conductive lines and in electrical contact with the node location. The conductive material is then removed to a degree sufficient to form an isolated plug of conductive material over the node location and between the four conductive lines.

BRIEF DESCRIPTION OF THE DRAWINGS

Preferred embodiments of the invention are described below with reference to the following accompanying drawings.

FIG. 7 is a view of a portion of the FIG. 6 wafer fragment taken along line 7—7 in FIG. 6.

FIG. 8 is a view of the FIG. 7 wafer fragment at a processing step subsequent to that shown by FIG. 7.

FIG. 9 is a view of the FIG. 7 wafer fragment at a processing step subsequent to that shown by FIG. 8.

FIG. 10 is a view of the FIG. 7 wafer fragment at a processing step subsequent to that shown by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
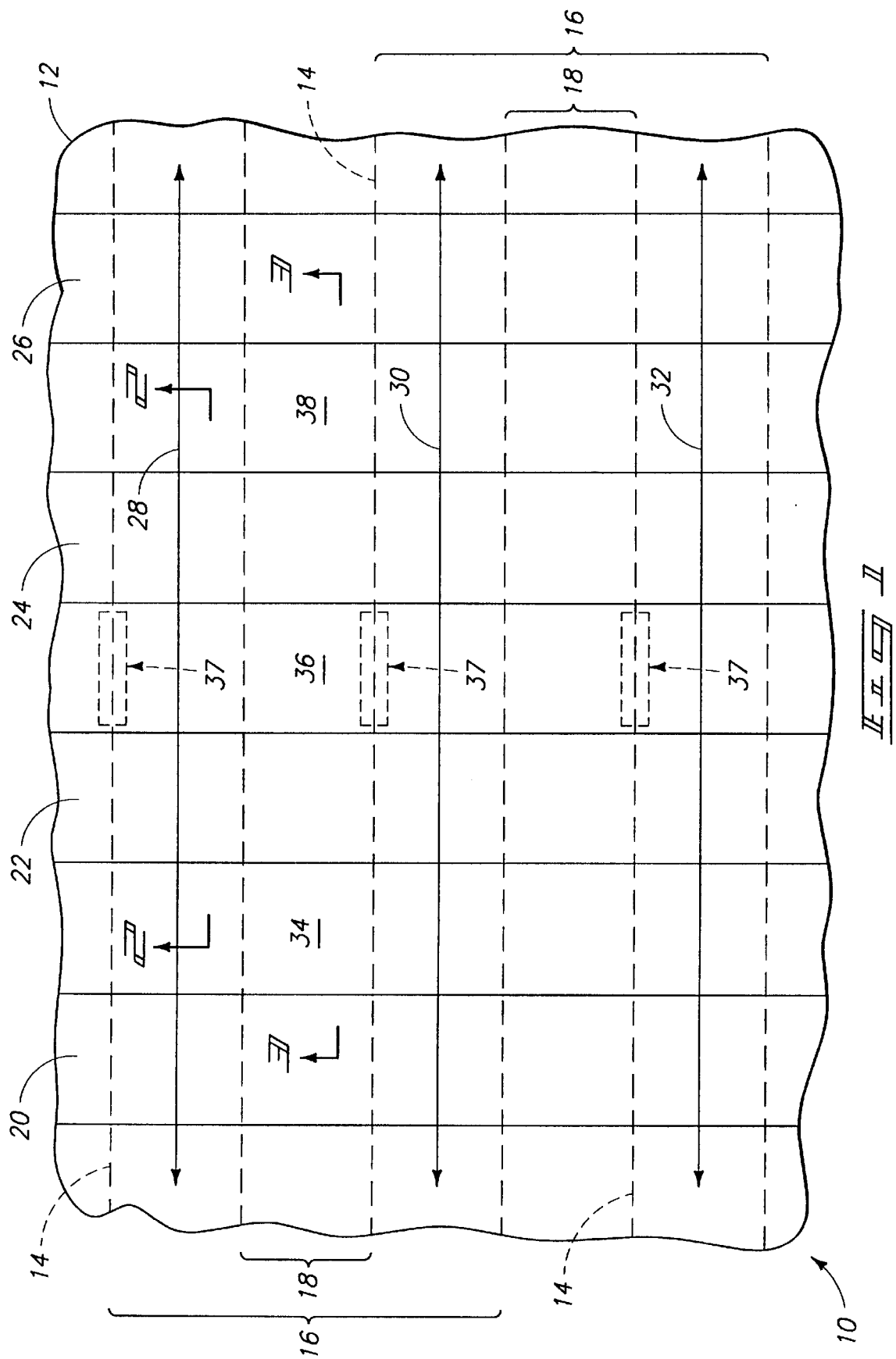
FIG. 1 is a top plan view of a semiconductor wafer fragment at one processing step in accordance with the invention.

Referring to FIG. 1, a semiconductor wafer fragment is shown generally at 10 and comprises a semiconductive substrate 12. In the context of this document, the term "semiconductive substrate" is defined to mean any construction comprising semiconductive material, including, but not limited to bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In the preferred embodiment, substrate 12 comprises an integrated circuit memory array area and a peripheral area. For purposes of the discussion herein, only a portion of the memory array area is shown.

A plurality of isolation oxide runners 14 are formed within substrate 12. One method of forming such runners is by trench and refill techniques in which substrate portions are etched away and back-filled with isolation oxide. Subsequent planarization provides the illustrated isolation oxide runners. Respective pairs of runners such as pairs 16 define continuous active areas or regions therebetween, such as respective active areas or regions 18. Active areas or regions 18 constitute continuous active areas which are formed within or relative to substrate 12. A plurality of laterally spaced apart insulative conductive lines 20, 22, 24, and 26, at least some of which are word lines, are formed over substrate 12 and disposed generally transverse individual isolation oxide runners 14. The illustrated conductive lines are formed, in the preferred embodiment, to have respective insulative or insulating sidewall spacers (shown in FIG. 2 but not specifically designated) and insulative or insulating caps (shown in FIG. 2 but not specifically designated).

Conductive lines 20, 22, 24, and 26 constitute a first series of conductive lines which are formed relative to substrate 12. In the illustrated and preferred embodiment, substrate 12 supports integrated circuitry which forms memory cells. Even more preferably, such memory cells constitute dynamic random access memory cells. Accordingly, word line pair 22, 24 share an intervening contact of adjacent pairs of memory cells, which in turn share a diffusion region (described below) in substrate 12. Electrical isolation between the adjacent pairs of memory cells is provided by intervening conductive isolation lines 20, 26 which are formed in conjunction with the formation of word lines 22, 24. Lines 20, 26 in operation are connected with ground or a suitable negative voltage and effectively substitute for the electrical isolation formerly provided by field oxide.

Figure 2:
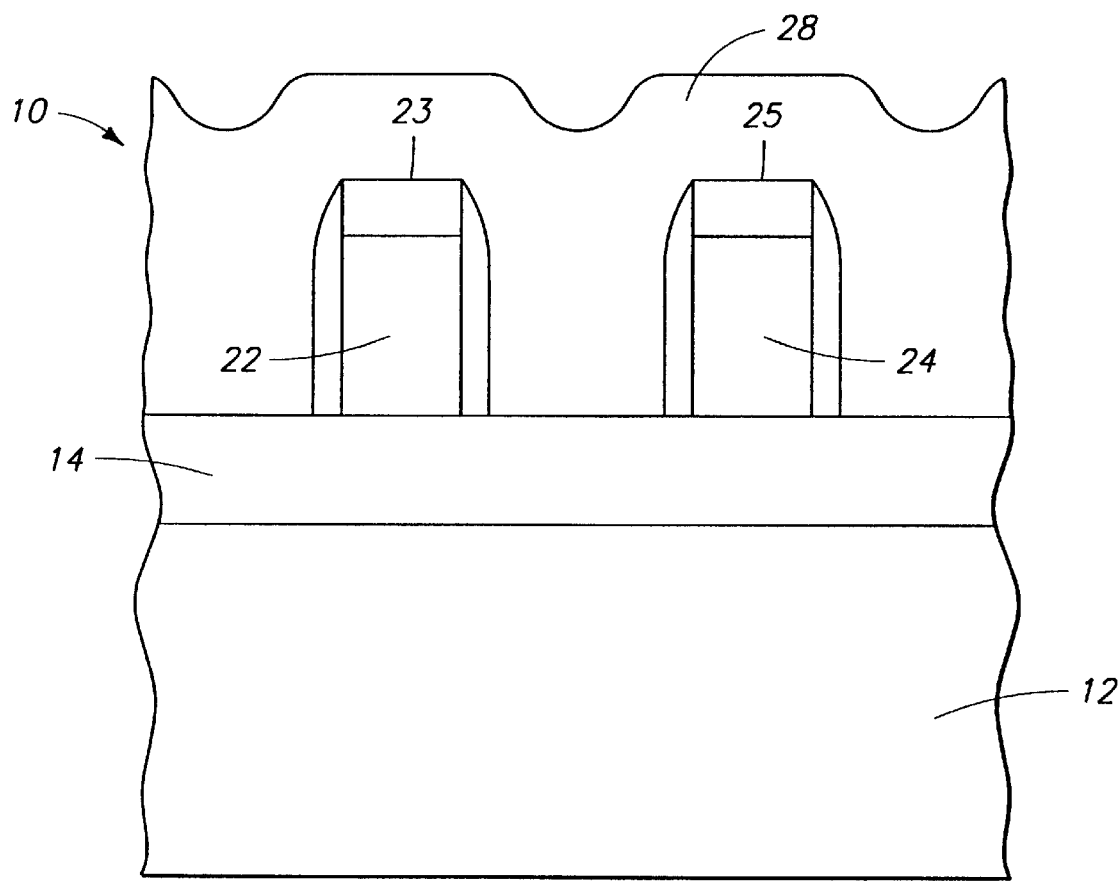
FIG. 2 is a view of the FIG. 1 wafer fragment taken along line 2—2 in FIG. 1.
Figure 3:
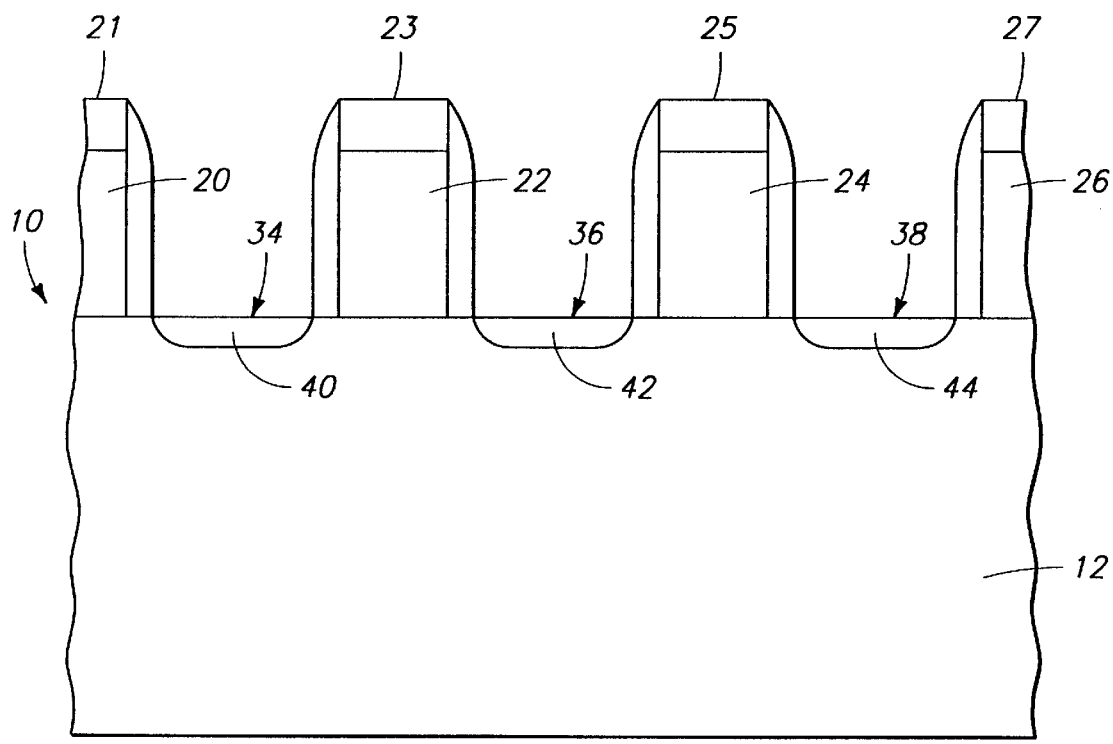
FIG. 3 is a view of the FIG. 1 wafer fragment taken along line 3—3 in FIG. 1.

Referring to FIGS. 1–3, conductive lines 20, 22, 24, and 26 have respective conductive line tops 21, 23, 25, and 27. Such line tops are defined by the insulating or insulative caps mentioned above. A plurality of laterally spaced apart insulated conductive memory cell bit lines 28, 30, and 32 are formed elevationally outwardly of conductive lines 20, 22, 24, and 26 and their respective conductive line tops, and are disposed generally transverse relative to the word lines. For purposes of illustration and clarity, the bit lines are indicated in FIG. 1 as a second series of parallel lines at least portions of which are disposed elevationally over the first series lines 20, 22, 24, and 26. In the illustrated and preferred embodiment, individual bit lines are formed elevationally over respective individual isolation oxide runners 14 as best shown in FIG. 2 for bit line 28 in corresponding extent and shape.

As formed, the first and second series of conductive lines collectively constitute a plurality of upstanding devices, with individual conductive word/isolation lines and bit lines constituting a grid of insulated lines which are formed relative to substrate 12.

Referring to FIGS. 1 and 3, a plurality of node locations 34, 36, and 38 with which electrical connection is desired are defined by the grid of upstanding devices and between conductive line pairs 20, 22, and 22, 24, and 24, 26 which are formed elevationally outwardly thereof. Although only three node locations are shown for purposes of illustration, other node locations are formed over the array area defined by substrate 12. In the illustrated and preferred embodiment, node locations 34, 36, and 38 constitute respective diffusion regions 40, 42, and 44 which are outwardly exposed. As formed, node locations 34, 36, and 38 also constitute first substrate locations which are laterally surrounded with insulating material. In the illustrated example, such insulating material constitutes insulative portions of first series conductive lines 20, 22, 24, and 26, and second series conductive bit lines 28, 30, and 32 which are formed elevationally outwardly of and generally transverse relative to conductive lines 20, 22, 24, and 26. In the illustrated and preferred embodiment, the conductive word/isolation and bit lines are formed to define an adjacent active area substrate location (corresponding to respective node locations 34, 36, and 38) which is laterally surrounded by four of the insulated conductive lines. In this example, two of such lines constitute first series lines, and two of such lines constitute second series lines.

In the illustrated example, a mask can and preferably is utilized to define and expose a plurality of areas 37 (FIG. 1) proximate respective bit lines 28, 30, and 32. Areas 37 constitute areas which laterally expose respective sidewall spacers over the diagrammatically illustrated bit lines 28, 30, and 32. Typically, such sidewall spacers are formed from an oxide or nitride material. In a preferred embodiment, the sidewall spacers of conductive lines 20, 22, 24, and 26 comprise a nitride material while those of bit lines 28, 30, and 32 comprise an oxide material. The exposed sidewall portions 37 of bit lines 28, 30, and 32 are etched in a wet etch comprising HF at a substantially higher rate than the nitride material sidewalls of conductive lines 20, 22, 24, and 26. Accordingly, such enables contact to be made relative to the bit lines without appreciably etching any inadvertently exposed sidewall material of conductive lines 20, 22, 24, and 26.

Figure 4:
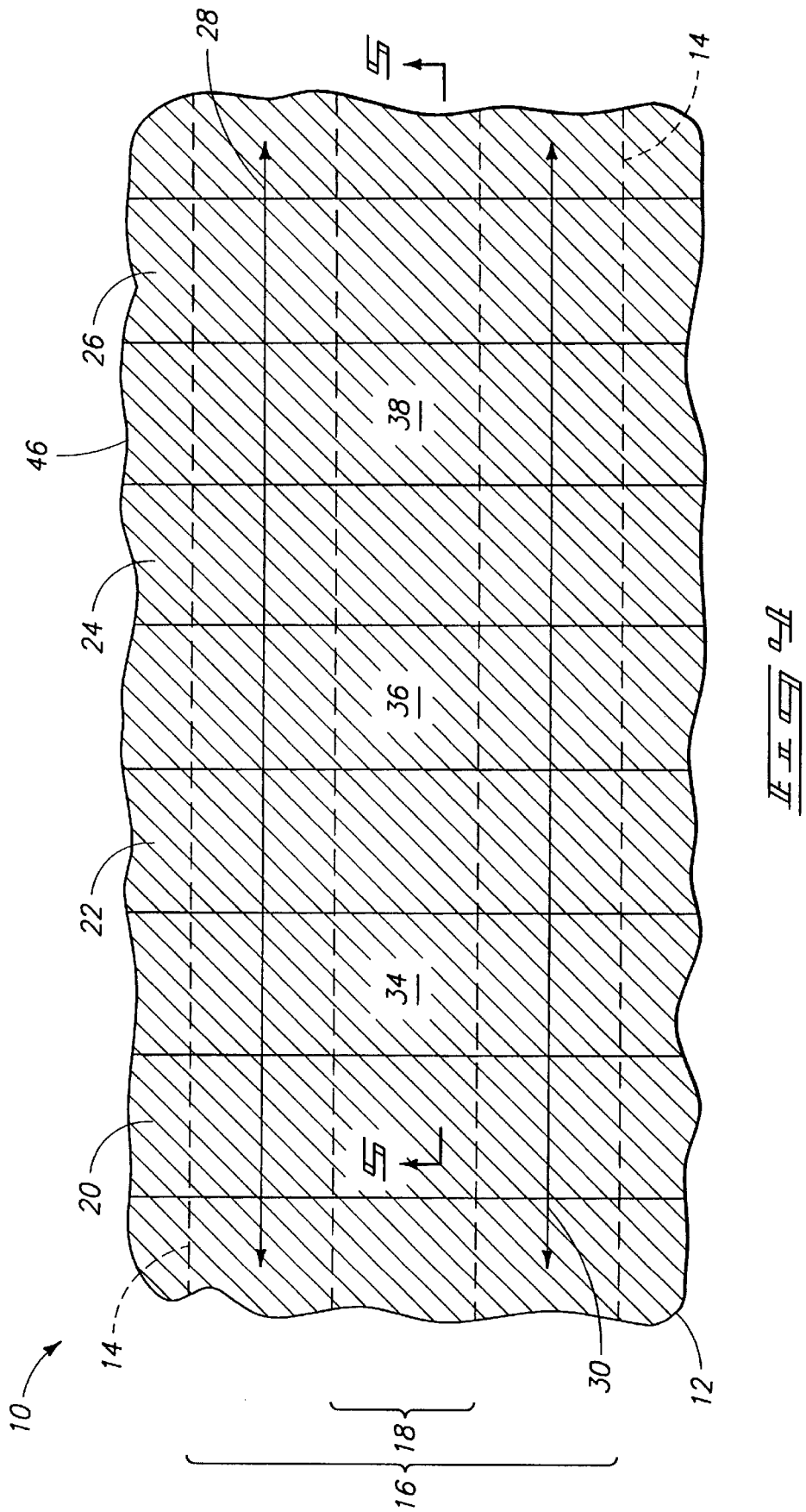
FIG. 4 is a view of a portion of the FIG. 1 wafer fragment at a processing step subsequent to that shown by FIG. 1.
Figure 5:
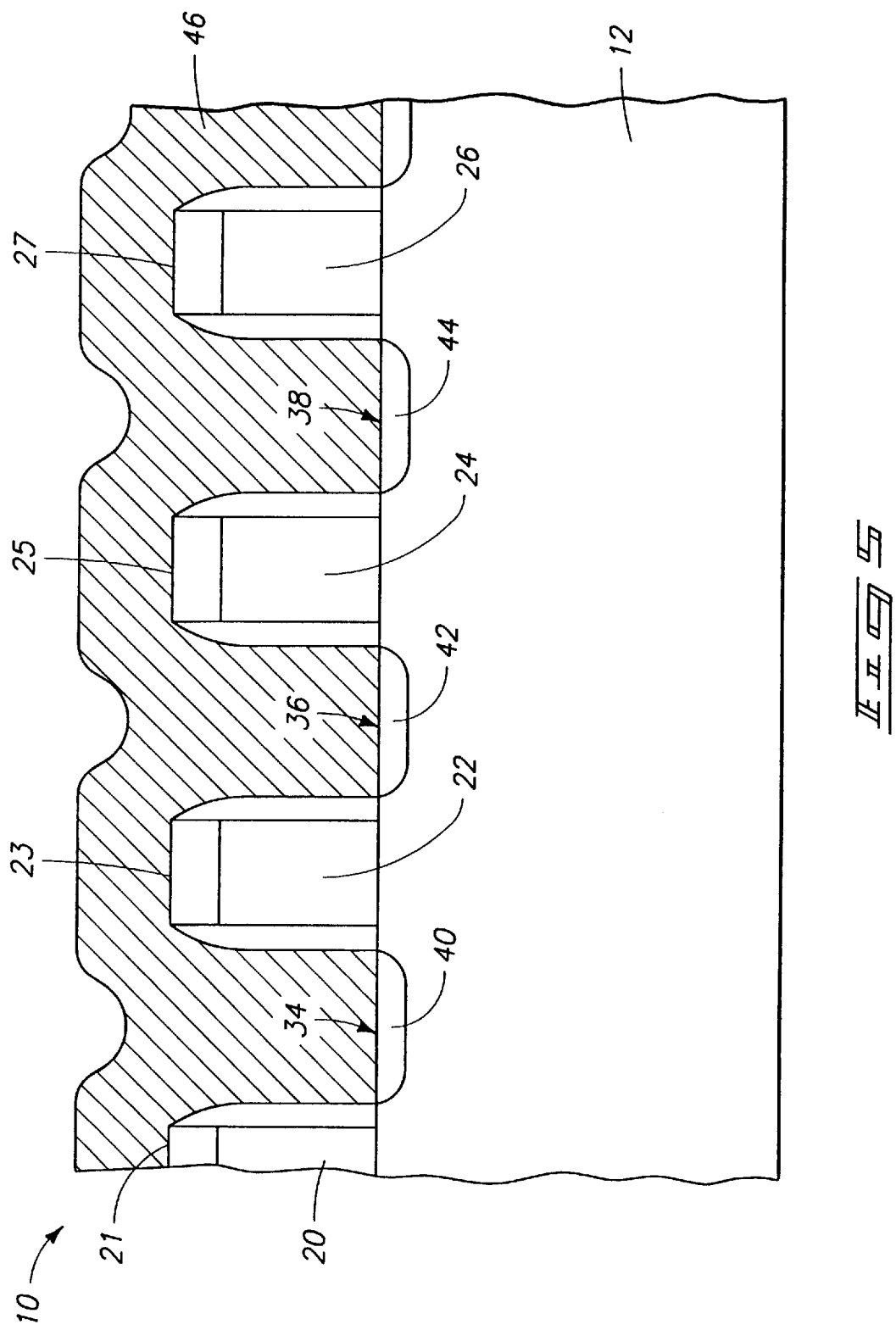
FIG. 5 is a view of the FIG. 4 wafer fragment taken along line 5—5 in FIG. 4.

Referring to FIGS. 4 and 5, a fragmentary portion of the FIG. 1 substrate is shown. After node locations 34, 36, and 38 are surrounded with the preferred insulating material and with the bit line conductive sidewall portions being effectively exposed, conductive material 46 is formed or deposited over the grid and the exposed node locations. Exemplary materials for conductive material 46 are polysilicon, tungsten, and the like. Preferably, such conductive material is chemical vapor deposited to achieve a degree of conformal coverage. Accordingly, conductive material 46 is deposited over the conductive lines and in electrical connection with the respective node locations as shown in FIG. 5. Conductive material 46 is also preferably in contact with the exposed portions of the bit line sidewalls corresponding to areas 37 (FIG. 1), thereby forming an electrical connection with node location 36, which, in turn, will form a connection through a word line/gate with a storage node location described below. In the preferred embodiment, a desired amount of conductive material can be less than the height of adjacent conductive lines, but an amount which is sufficient to fill the spaces between the lines.

Figure 6:
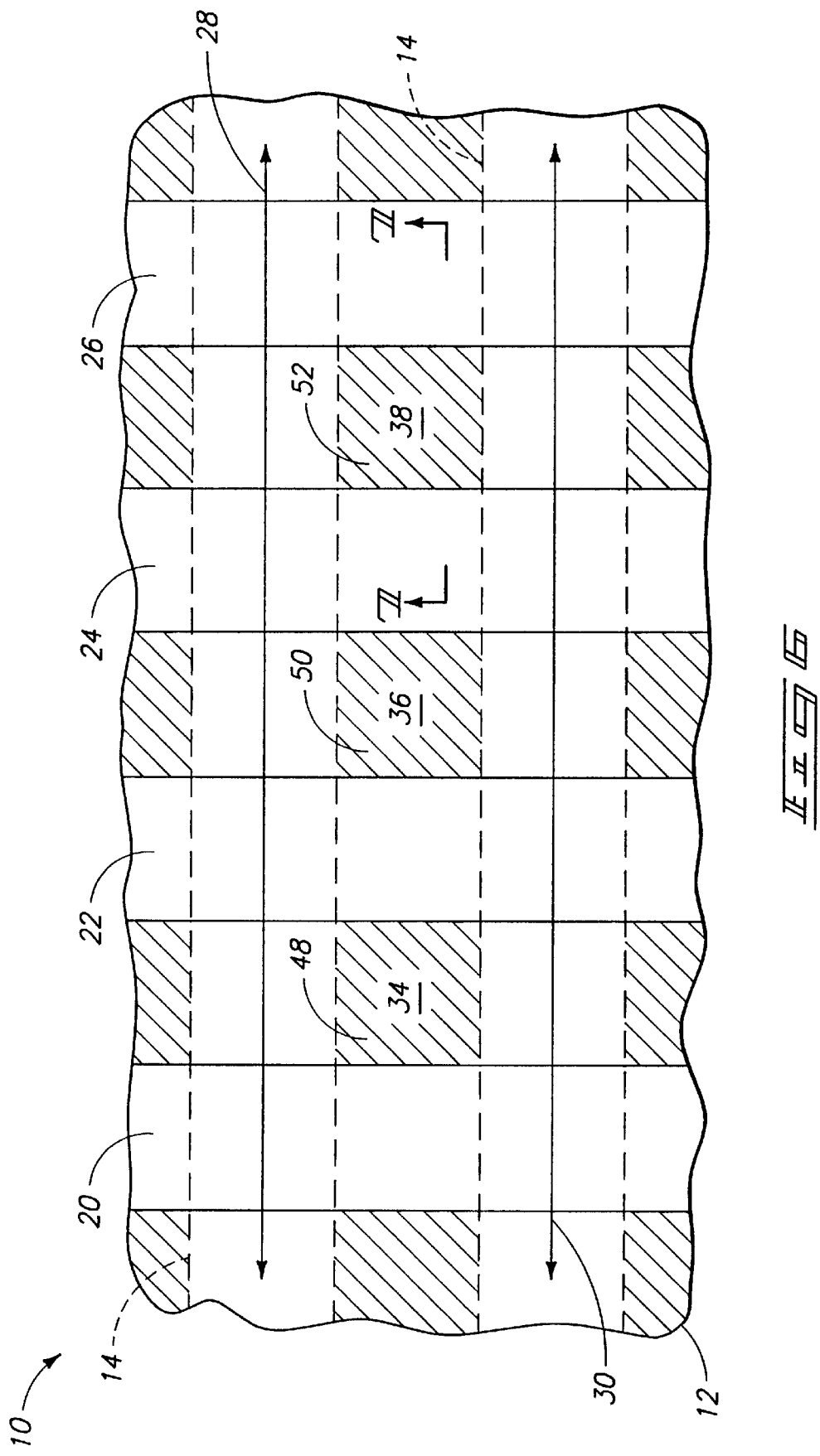
FIG. 6 is a view of the FIG. 4 wafer fragment at a processing step subsequent to that shown by FIG. 4.

Referring to FIGS. 6 and 7, conductive material 46 is removed to a degree sufficient to form isolated plugs 48, 50, and 52 of conductive material (FIG. 6) respectively, over node locations 34, 36, and 38. Plug 52 is shown in its cross-sectional entirety in FIG. 7. In the illustrated and preferred embodiment, a photomaskless etch is conducted of conductive material 46 (FIG. 5) to a degree which is sufficient to remove the conductive material from elevationally outward of the insulating material constituting portions of the conductive lines, and to a degree which is sufficient to leave plugs 48, 50, and 52 over respective node locations 34, 36, and 38. Accordingly, the photomaskless etch constitutes an etch which is conducted in the absence of any photomasking material laterally proximate the node location. Even more preferably, such etch is conducted in the absence of any photomasking material over the substrate. The photomaskless etch desirably permits conductive material to be removed from outside or outwardly of the illustrated array area without the need for a mask in or over the array area. The preferred etching of conductive material 46 constitutes an isotropic etch of the material to a degree sufficient to completely remove conductive material from over the conductive word/isolation lines, and to expose the insulating material portions of lines 24, 26. Exemplary etches include wet or dry etches, with the latter being preferred. Further, exemplary dry etch chemistries can include one or more of the following: $CF_4$, $SF_6$, or $NF_3$. Accordingly, the conductive material constituting plug 52 is preferably recessed to elevationally below uppermost surfaces or line tops 25, 27.

Referring to FIG. 8, a layer 54 is formed over substrate 12. Preferably, layer 54 comprises an insulating or insulative material such as borophosilicate glass which is formed over the substrate. An exemplary thickness for layer 54 is 0.5 μm to 1.5 μm.

Referring to FIG. 9, an opening 56 is etched or otherwise formed through insulative layer 54 to outwardly expose conductive material of plug 52 overlying node location 38. Preferably such opening is anisotropically etched to outwardly expose plug 52.

Referring to FIG. 10, a second, spaced apart substrate location 58 is formed elevationally outward of and in electrical contact with the first substrate location defined by node location 38. In the illustrated and preferred embodiment, the spaced apart first and second substrate locations constitute part of an integrated circuitry memory cell and substrate location 58 constitutes a storage capacitor having a storage node 60, a dielectric layer 62, and cell plate 64. In the illustrated example, at least a portion of the storage capacitor is disposed elevationally outwardly, above or over the previously formed bit lines 28, 30, and 32 (FIG. 1). Accordingly, such constitutes a capacitor-over-bit-line dynamic random access memory cell. Other integrated circuit first and second substrate locations are possible, including ones which are not necessarily associated with the above described integrated circuit memory cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrically conductive plug to a node location comprising:

providing a node location to which electrical connection is to be made;

laterally surrounding the node location with insulating material and leaving the node location outwardly exposed without etching a contact opening through the insulating material to laterally surround the node location;

after the surrounding, depositing conductive material over the insulating material and the exposed node location; and conducting a photomaskless isotropic etch of the conductive material to a degree sufficient to remove conductive material from elevationally outward of at least some of the insulating material to outwardly expose the at least some of the insulating material and to leave a plug of the conductive material over the node location.

2. The method of claim 1, wherein the node location constitutes part of an integrated circuitry memory cell and the providing of the node location comprises:

forming two laterally spaced apart conductive lines; and forming a diffusion region between the conductive lines, the diffusion region comprising the node location.

3. The method of claim 1, comprising providing the node location as part of a dynamic random access memory cell, and wherein the surrounding of the node location comprises forming insulated bit lines elevationally outwardly of the node location prior to conducting the photomaskless isotropic etch.

4. The method of claim 1, comprising:

providing the node location as part of a dynamic random access memory cell;

wherein the surrounding of the node location comprises forming insulated bit lines elevationally outwardly of the node location;

after the forming of the insulated bit lines, conducting the photomaskless isotropic etch; and after the conducting of the photomaskless isotropic etch, forming a memory cell storage capacitor to be in electrical contact with the plug.

5. The method of claim 1, wherein the providing of the node location comprises forming a diffusion region within a substrate as part of an integrated circuitry memory cell and the surrounding of the node location comprises:

forming a grid of conductive lines over the substrate, the grid comprising a) a first series of conductive lines which are formed over the substrate at least two of the conductive lines constitute conductive word lines, the diffusion region being formed between two laterally spaced apart first series lines, and b) a second series of conductive lines at least some of which constitute conductive bit lines formed elevationally outwardly of and generally transverse relative to the first series conductive lines, at least some of the diffusion region being outwardly exposed between respective individual first and second series lines.

6. A method of forming an electrical connection with an integrated circuitry memory cell node location comprising:

forming a plurality of insulated conductive lines over a semiconductive substrate, at least some of the conductive lines extending over a semiconductive substrate active area and constituting word lines, at least some other of the conductive lines having at least some portions disposed elevationally over the word lines and constituting bit lines, the conductive lines being formed to define an active area substrate location laterally surrounded by at least four of said insulated conductive lines;

depositing conductive material over the substrate and the insulated conductive lines and in electrical contact with the active area substrate location; and with the conductive material being outwardly exposed over the active area substrate location and over the at least four of said insulated conductive lines, isotropically etching the conductive material to a degree sufficient to form an isolated plug over the node location and between the at least four of said insulated conductive lines.

7. The method of forming an electrical connection of claim 6 further comprising after the etching of the conductive material, forming at least one memory cell storage capacitor to be in electrical contact with said isolated plug.

8. The method of forming an electrical connection of claim 6, wherein the etching of the conductive material comprises etching the conductive material to a degree sufficient to expose at least some material constituting insulated portions of at least some of the conductive lines.

9. The method of forming an electrical connection of claim 6, wherein the etching of the conductive material comprises etching the conductive material to a degree sufficient to recess the conductive material to elevationally below an insulative portion of an adjacent conductive line.

10. The method of forming an electrical connection of claim 6, wherein the isotropic etching comprises conducting the etching with no photoresist overlying any portion of the substrate.

11. In formation of a capacitor-over-bit-line dynamic random access memory cell, a method of making electrical connection to a node location comprising:

forming a pair of conductive lines over a semiconductive substrate, the conductive lines defining a node location therebetween and relativeto an active area on the substrate;

depositing conductive material over the conductive lines and between the conductive lines in electrical contact with the node location;

isotropically etching the conductive material to a degree sufficient to completely remove conductive material from over the pair of conductive lines and to leave a conductive material plug over the node location;

after the isotropic etching, forming an insulative material over the substrate and the node location; and forming an opening through the insulative material to outwardly expose the conductive material plug.

12. The method of claim 11, wherein the isotropic etching comprises conducting the etching in the absence of any photomasking material over the substrate active area.

13. The method of claim 11, wherein the substrate comprises an array area and a peripheral area, the node location being defined within the array area, and wherein the isotropic etching comprises conducting the etching in the absence of any photomasking material over the array area.

14. The method of claim 11 comprising prior to the isotropic etching, forming memory cell bit lines over the substrate.

15. The method of claim 11 comprising prior to the isotropic etching, forming memory cell bit lines over the substrate and further wherein the isotropic etching comprises conducting the etching in the absence of any photomasking material over the substrate active area.

16. In formation of a capacitor-over-bit-line dynamic random access memory device, a method of making electrical connection to a node location comprising:

forming a pair of spaced apart isolation oxide runners received within a semiconductive substrate;

forming a pair of conductive lines over the semiconductive substrate, the conductive lines extending generally transverse relative to the isolation oxide runners, at least one of the conductive lines constituting a conductive word line;

forming a pair of conductive memory cell bit lines, individual bit lines being disposed elevationally over respective individual isolation oxide runners and generally transverse the pair of conductive lines;

forming a diffused node location adjacent the at least one conductive word line;

depositing conductive material over the substrate and in electrical contact with the diffused node location;

isotropically etching the conductive material to a degree sufficient to completely remove conductive material from over the pair of conductive lines and to leave a conductive material plug over the diffused node location;

after the isotropic etching, forming an insulative material over the substrate and the diffused node location; and forming an opening through the insulative material to outwardly expose the conductive material plug.

17. The method of claim 16, wherein the at least one conductive word line of the pair of conductive lines constitutes a portion of a memory cell, and the forming of the pair of conductive lines comprises forming the other of the pair of conductive lines to be a conductive isolation line for providing electrical isolation relative to an adjacent memory cell.

18. A method of forming an electrical connection between elevationally spaced apart substrate locations comprising:

forming a first substrate location to which electrical connection is to be made, the first substrate location comprising a diffusion region which is received within the substrate;

forming insulating material to laterally surround the first substrate location to a degree sufficient to leave at least a portion of the diffusion region outwardly exposed, the insulating material being formed to surround the first substrate location in separate and discrete depositing steps;

depositing conductive material over the insulating material and in electrical contact with the first substrate location;

in the absence of any photomasking material laterally proximate the first substrate location, etching the conductive material to a degree sufficient to recess the conductive material to elevationally below an uppermost surface of the insulating material and to leave a plug of conductive material over the first substrate location;

forming an insulating layer over the first substrate location;

etching a contact opening through the insulating layer to expose at least a portion of the plug of conductive material; and forming a second substrate location elevationally outward of the first substrate location and in electrical contact with the plug of conductive material.

19. The method of claim 18, wherein the spaced apart substrate locations constitute part of an integrated circuitry memory cell, and the forming of the second substrate location comprises forming a storage capacitor.

20. The method of claim 18, wherein the spaced apart substrate locations constitute part of an integrated circuitry memory cell, and wherein:

the forming of the insulating material to laterally surround the first substrate location comprises forming a plurality of insulated conductive lines outwardly of the first substrate location; and the forming of the second substrate location comprises:

after forming the plurality of insulated conductive lines, forming a storage capacitor at least some of which being disposed elevationally outwardly of the conductive lines.

21. The method of claim 18, wherein the spaced apart substrate locations constitute part of an integrated circuitry memory cell, and wherein:

the forming of the insulating material to laterally surround the first substrate location comprises forming a plurality of insulated conductive lines outwardly of the first substrate location, the plurality of insulated conductive lines comprising: a) a first series of conductive lines some of which constitute conductive word lines and others of which constitute conductive isolation lines, and b) a second series of conductive lines disposed elevationally outwardly of and generally transverse relative to the first series of conductive lines, at least some of the second series of conductive lines constitute bit lines; and the forming of the second substrate location comprises:

after forming the plurality of insulated conductive lines, forming a storage capacitor at least some of which being disposed elevationally outwardly of the bit lines.

22. The method of claim 18, wherein the etching of the conductive material comprises isotropically etching the conductive material.

23. A method of forming an electrically conductive plug to a node location comprising:

providing a node location to which electrical connection is to be made;

laterally surrounding the node location with a plurality of upstanding devices and leaving the node location outwardly exposed;

after the surrounding, depositing conductive material over the upstanding devices and the exposed node location; and with the conductive material being outwardly exposed over the node location and over the plurality of upstanding devices immediately adjacent the node location, isotropically etching the conductive material to a degree sufficient to form an isolated plug over the node location between the upstanding devices.

24. The method of claim 23, wherein the surrounding of the node location with a plurality of upstanding devices comprises forming a plurality of insulated conductive lines elevationally outwardly of the node location.

25. The method of claim 23, wherein the surrounding of the node location with a plurality of upstanding devices consists essentially of forming a plurality of insulated conductive lines elevationally outwardly of the node location.

26. The method of claim 23, wherein:

the providing of the node location comprises forming a diffusion region within a substrate; and the surrounding of the node location with a plurality of upstanding devices comprises:

forming a grid of conductive lines over the substrate, the grid comprising a) a first series of conductive lines at least some of which constitute conductive word lines, the diffusion region being formed between two laterally spaced apart first series lines, and b) a second series of conductive lines at least some of which constitute bit lines formed elevationally outwardly of and generally transverse relative to the first series lines.

27. The method of claim 23, wherein:

the providing of the node location comprises forming a diffusion region within a substrate; and the surrounding of the node location with a plurality of upstanding devices comprises:

forming a grid of conductive lines over the substrate, the grid comprising a) a first series of conductive lines at least some of which constitute conductive word lines and others of which constitute conductive isolation lines for providing electrical isolation within continuous substrate active area regions formed therebeneath, the diffusion region being formed between two laterally spaced apart first series lines, and b) a second series of conductive lines at least some of which constitute bit lines formed elevationally outwardly of and generally transverse relative to the first series lines, the grid comprising a plurality of memory cells.

28. A method of forming an electrically conductive plug to a node location comprising:

forming a plurality of isolation oxide runners within a substrate, respective pairs of runners defining continuous substrate active areas therebetween;

forming a first series of insulated conductive lines over the substrate, individual first series lines being laterally spaced apart relative to one another and disposed generally transverse relative to the isolation oxide runners, individual first series lines having respective line tops comprising insulating material;

forming a second series of insulated conductive lines over the substrate, individual second series lines being laterally spaced apart relative to one another and disposed generally transverse the first series lines, wherein the first and second series lines constitute a grid which defines at least one outwardly exposed node location with which electrical connection is to be made, the node location being laterally surrounded with insulating material which constitutes portions of the grid of first and second series lines;

depositing conductive material over the grid and the exposed node location; and conducting a photomaskless isotropic etch of the conductive material to a degree sufficient to recess the conductive material to elevationally below the first series line tops and to leave a plug of conductive material over the node location.

29. The method of claim 28, wherein the forming of the second series of insulated conductive lines comprises forming at least some individual second series lines elevationally over respective isolation oxide runners.

* * * * *

UNITED STATES PATENT AND TRADEMARK OFFICE
CERTIFICATE OF CORRECTION

PATENT NO. : 5,872,048
DATED : 02/16/99
INVENTOR(S) : Alan R. Reinberg

It is certified that error appears in the above-identified patent and that said Letters Patent is hereby corrected as shown below:

Column 7, line 6, after "and", delete "relativeto" and replace with --relative to--.

Signed and Sealed this

Twentieth Day of July, 1999

Attest:

Attesting Officer

Q. TODD DICKINSON

Acting Commissioner of Patents and Trademarks